US007408387B2

United States Patent
Suenaga

(10) Patent No.: US 7,408,387 B2
(45) Date of Patent: Aug. 5, 2008

(54) OUTPUT BUFFER CIRCUIT WITH CONTROL CIRCUIT FOR CHANGING RESISTANCE OF OUTPUT RESISTOR PAIR

(75) Inventor: Shuji Suenaga, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/517,295

(22) Filed: Sep. 8, 2006

(65) Prior Publication Data

US 2007/0057702 A1    Mar. 15, 2007

(30) Foreign Application Priority Data

Sep. 13, 2005   (JP) .............................. 2005-264847

(51) Int. Cl.
H03K 3/00 (2006.01)
(52) U.S. Cl. ....................................... 327/108; 327/563
(58) Field of Classification Search ................. 327/108, 327/112, 52, 65, 560–563; 330/252, 253
See application file for complete search history.

(56) References Cited

U.S. PATENT DOCUMENTS

| 6,281,715 | B1 * | 8/2001 | DeClue et al. ................. 327/65 |
| 6,288,581 | B1 * | 9/2001 | Wong ........................... 327/108 |
| 6,703,894 | B1 * | 3/2004 | Stockstad et al. ............ 327/552 |
| 6,853,220 | B2 * | 2/2005 | De Laurentiis et al. ....... 327/108 |
| 6,897,685 | B2 | 5/2005 | Sato |
| 6,956,407 | B2 * | 10/2005 | Baig et al. ..................... 327/65 |
| 7,164,299 | B2 * | 1/2007 | Nedachi ........................ 327/112 |
| 7,183,813 | B2 * | 2/2007 | Kasanyal et al. ............... 327/65 |
| 7,256,626 | B2 * | 8/2007 | Nguyen et al. ............... 327/112 |

FOREIGN PATENT DOCUMENTS

| JP | 2004-015621 A | 1/2004 |
| JP | 2004-088693 A | 3/2004 |

* cited by examiner

Primary Examiner—N. Drew Richards
Assistant Examiner—Hai L. Nguyen
(74) Attorney, Agent, or Firm—Foley & Lardner LLP

(57) ABSTRACT

Disclosed is an output buffer circuit including a first differential transistor pair for differentially receiving a data signal from a differential input pair; and a second differential transistor pair for differentially receiving an emphasis data signal from another differential input pair; a pair of output resistor circuits via which the drains of first and second differential transistor pairs are connected to a power supply, said output resistor circuits each including a transistor; and a logic circuit adapted for receiving the data signal and the emphasis signal and for supplying a control signal which is of first and second values at the time of preemphasis and at other times to the transistors of the output resistor circuit, wherein the output resistance is relatively made larger at the time of emphasis, while being relatively smaller at the time of deemphasis.

9 Claims, 15 Drawing Sheets

FIG. 8

|  | REFERENCE | ALL CURRENTS FIXED | AMPLITUDE FIXED FOR De-Emp |
|---|---|---|---|
| IData[mA] | 18 | 17 | 20 |
| IEmp[mA] | 6 | 7 | 8 |
| IData+IEmp[mA] | 24 | 24 | 28 |
| Vemp[mV] | 600 | 600 | 700 |
| VdeEmp[mV] | 300 | 250 | 300 |
| Vemp/VdeEmp | 2 | 2.4 | 2.33 |

FIG. 11

| | WITHOUT MEASURES TAKEN FOR REDUCING THE JITTER | WITH INVENTIVE MEASURES TAKEN FOR REDUCING THE JITTER | WITH STATE-OF-THE-ART MEASURES TAKEN FOR REDUCING THE JITTER |
|---|---|---|---|
| IData[mA] | 18 | 18 | 20 |
| IEmp[mA] | 6 | 6 | 8 |
| IData+IEmp[mA] | 24 | 24 | 28 |
| Vemp[mV] | 600 | 678 | 700 |
| VdeEmp[mV] | 300 | 300 | 300 |
| VdeEmp/Vemp | 2 | 2.26 | 2.33 |
| Jitter[ps] | 131 | 99.6(-24%) | — (COMPARABLE WITH THE PRESENT PROPOSAL) |

US 7,408,387 B2

OUTPUT BUFFER CIRCUIT WITH CONTROL CIRCUIT FOR CHANGING RESISTANCE OF OUTPUT RESISTOR PAIR

FIELD OF THE INVENTION

This invention relates to an output buffer circuit for a semiconductor device. More particularly, this invention relates an output buffer circuit equipped with a preemphasis function.

BACKGROUND OF THE INVENTION

FIG. 1 is a diagram showing the configuration of a conventional CML (Current Mode Logic) driver circuit. The CML driver circuit includes N channel MOS transistors (NMOS transistors) N1 and N2, composing a differential circuit and constituting a switching device. The NMOS transistors N1 and N2 have coupled sources connected to a constant current source CS, have gates connected to differential input terminals INT and INB, respectively and have drains connected to a power supply VDD via output resistors Rout1 and Rout2. The drains of the NMOS transistors N1 and N2 are also connected to differential output terminals DOT and DOB, respectively. The differential output terminals DOT and DOB are connected to both ends of termination resistors Rterm1 and Rterm2, with the output potential being of an analog level.

The CML driver circuit, shown in FIG. 1, is of a circuit configuration generally used in high-speed differential signal transmission. However, since a constant current source is needed, it is supposed that current consumption tends to be increased.

In particular, there is no marked difference in characteristics of SerDes macros (interface macros each including a serializer for parallel-serial converting parallel data and serially outputting the resulting data at an output buffer circuit and a deserializer receiving the serial data at an input buffer and serial-parallel converting the so received serial data), manufactured by competing vendors, as long as the SerDes Macros manufactured are those that meet relevant standards. It is noted that each of the SerDes macros of different vendors carries larger numbers of CML drivers thereon. As a matter of fact, it is the power consumption which mainly determines the dominance of products by the different vendors.

The waveform of a transmission signal tends to deteriorate due to the increase of transmission speed and the increase of transmission distance. With wide spread use of a broadband system and high speed transmission, waveform deterioration, ascribable to transmission line loss, as shown schematically in FIG. 2, is becoming of serious concern. In case the transmission side (output buffer circuit side) is not equipped with preemphasis function which emphasizes the amplitude of the output signal at the time points of output signal transitions, the amplitude at the transition point of the signal which has been transmitted on the transmission line and received by a receiving end, has get attenuated by distortion.

In particular, in the transmission of the GHz order, the logarithm of the signal attenuation, ascribable to the skin effect and dielectric loss, is increased in direct proportion to the logarithm of the frequency. For this reason, an output waveform is intentionally subjected to overshooting, on the transmission side, at the rise time of an output signal waveform, based on the preemphasis function, as shown in FIG. 3, to prevent waveform deterioration otherwise caused on the receiving side, that is, to prevent the jitter from increasing. This preemphasis function has proven indispensable means for transmission on the GHz order.

It is now assumed that, in FIG. 1, an input differential signal of the waveform shown in FIG. 4 is supplied to gates INT and INB of NMOS transistors N1 and N2. If, at a timing t3 of FIG. 4, a HIGH side potential and a low side potential are supplied to the gates INT and INB of the NMOS transistors N1 and N2, respectively, the NMOS transistors N1 and N2 are turned on and off, respectively. This establishes the following two current paths between the power supply potential VDD and the ground:

(1) A current path of output resistor Rout1→NMOS transistor N1; and (2) another current path of output resistor Rout2→termination resistor Rterm1→termination resistor Rterm2→NMOS transistor N1.

In this case, the output terminal DOT is at a high potential, and the output terminal DOB is at a low potential. Meanwhile, in case the input logic is reversed, as indicated from a timing t5 to a timing t6 in FIG. 4, the output logic is such that the output terminal DOT is at the low side potential and the output terminal DOB is at the high side potential. The ratio between two currents is determined by the values of output resistors and termination resistors and, from these values of the currents and the resistances, the output potential and the amplitude (high side potential minus low side potential) are determined.

An amplitude Vout, an output high voltage VOH of the output signal and an output low voltage VOL of the output signal, at a timing t1 in FIG. 4, are indicated by the following equations (1), (2) and (3) respectively:

$$\text{Amplitude } Vout = I \times \{Rout1/(Rout1+Rout2+Rterm1+Rterm2)\} \times (Rterm1+Rterm2) \quad (1)$$

$$\text{output high voltage } VOH = VDD - \{Rout2 \times I \times \{Rout1/(Rout1+Rout2+Rterm1+Rterm2)\}\} \quad (2)$$

$$\text{output low voltage } VOL = VDD - \{Rout1 \times I \times \{(Rout2+Rterm1+Rterm2)/(Rout1+Rout2+Rterm1+Rterm2)\}\} \quad (3)$$

In the above equations, the symbols used correspond to those of FIG. 1.

SUMMARY OF THE DISCLOSURE

FIG. 5 is the diagram showing the configuration of an output buffer having a preemphasis function (see Patent Document 1, for example). The output buffer includes a differential circuit, made up of NMOS transistors N1 and N2, which have coupled sources connected to a constant current source CS1, have gates connected to differential input terminals INT and INB, respectively, and have drains connected via output resistors Rout1 and Rout2 to a power supply (see FIG. 1). The output buffer also includes another differential circuit, made up of NMOS transistors N3 and N4 which, have sources connected in common and to a constant current source CS2, have gates connected to differential input terminals EMT and EMB, respectively, and have drains connected via output resistors Rout1 and Rout2 to the power supply. The coupled drains of the NMOS transistors N2 and N4 are connected to the output terminal DOT, while the coupled drains of the NMOS transistors N1 and N3 are connected to the output terminal DOB.

FIG. 6 shows differential data signals, supplied to the gate of the NMOS transistors N1 and N2 of FIG. 5, signal waveforms of emphasis data (emphasis logic signals) differentially supplied to the gates of the NMOS transistors N3 and N4 of FIG. 5, and signal waveforms at the differential output terminals DOT and DOB. Referring to FIG. 5, the ratio of the currents flowing through the output resistors and the termination resistors may be changed to vary the value of the amplitude between that at the time of preemphasis and that at the time of deemphasis (the state in which preemphasis is not effective).

The emphasis data (emphasis logic data) EMT and EMB correspond to signals which are inverted versions of the differential data signals (data logic signals) INT and INB delayed a predetermined time equivalent to one cycle time of t1.

At a timing t3 in FIG. 6, the amplitude of the output signal is emphasized. When the data signal at the non-inverting terminal INT is high, the data signal at the inverting terminal INB is low, the emphasis signal at the non-inverting terminal EMT, obtained on inverting the data signal and delaying the resulting signal by one cycle, is high and the emphasis signal at the inverting terminal EMB is low. Regarding the current IData on the side of the constant current source CS1, there are current paths between the power supply potential VDD as follows:

(A) a current path of output resistor Rout1→NMOS transistor N1, and (B) a current path of output resistor Rout2→termination resistor Rterm1→termination resistor Rterm2→NMOS transistor N1.

Regarding the current IEmp on the side of the constant current source CS2, there are (C) a current path of Rout1→NMOS transistor N3, and (D) a current path of output resistor Rout2→termination resistor Rterm1→termination resistor Rterm2→NMOS transistor N3. Assuming that Rout1=Rout2=Rterm1=Rterm2, the currents flowing through the resistor Rout1 and through the resistor Rout2 are given as follows:

the current flowing through Rout1 is (¾)×IData+(¾)×IEmp, and the current flowing through Rout2 is (¼)×IData+(¼)×IEmp.

At this time, the direction of the current IData flowing through the termination resistors Rterm1 and Rterm2 is the same as that of the current IEmp flowing through the termination resistors.

On the other hand, if, at a timing t4 of FIG. 6, at which the signal amplitude is reduced, the non-inverting terminal INT for the data signal is high, the inverting terminal INB for the data signal is low, the non-inverting terminal EMT for the emphasis signal, obtained on inverting the data signal and delaying the resulting signal by one cycle, is low and the inverting terminal EMB for the emphasis signal, is high, the current paths, shown below, are established between the power supply potential VDD and the ground GND.

That is, regarding the current IData on the side of the constant current source CS1, there are (E) a current path of output resistor Rout1→NMOS transistor N1, and (F) a current path of output resistor Rout2→termination resistor Rterm1→termination resistor Rout2→NMOS transistor N1, as at the timing t3.

Regarding the current IEmp on the side of the constant current source CS2, there are (G) a current path of output resistor Rout2→NMOS transistor N4, and (H) a current path of output resistor Rout1→termination resistor Rterm2→termination resistor Rterm1→NMOS transistor N4 so that the direction of the current IData flowing through the termination resistors Rterm1 and Rterm2 is reversed from that of the current IEmp flowing through the same termination resistors.

Assuming that Rout1=Rout2=Rterm1=Rterm2, the current flowing through the resistor Rout1 is (¾)×IData+(¼)×IEmp, and the current flowing through the resistor Rout2 is (¼)×IData+(¾)×IEmp.

In light of above, if the output voltages VOH and VOL are found from the output resistors Rout1 and Rout2 and the currents flowing therethrough, and the output amplitude Vout=VOH−VOL for preemphasis is compared to that for deemphasis.

Vout=(½)×Rout1×(IData+IEmp) at the time of preemphasis, and

Vout=(½)×Rout1×(IData−IEmp) at the time of deemphasis, so that an output waveform shown in FIG. 6 is obtained.

Meanwhile, there is disclosed in Patent Document 2 a configuration of an LVDS driver in which an edge of a pulse waveform in an input signal is detected and the current supplied to an output signal line through each switching device as from the so detected edge is increased for an extremely short time to improve the rise and fall characteristics and hence the frequency characteristics in the differential signal output to the output signal line.

[Patent Document 1]
Japanese Patent Kokai Publication No. JP-P2004-88693A

[Patent Document 2]
Japanese Patent Kokai Publication No. JP-P2004-15621A

The entire disclosures of these documents are incorporated herein by reference thereto.

The above-described conventional CML driver circuit is of a circuit constitution which is not meritorious from the perspective of current consumption. This fact represents a problem to be solved.

Furthermore, in case the jitter is to be diminished, using the preemphasis function, the degree of amplitude emphasis, that is, the ratio of the amplitude for emphasis to that for deemphasis, is critical, such that, as shown in FIGS. 7A and 7B, the longer the length of the transmission line, the higher should be the degree of amplitude emphasis (ratio of preemphasis).

In the conventional CML driver circuit, explained with reference to FIGS. 5 and 6, the current consumption is increased when the degree of amplitude emphasis is increased. Moreover, the conventional CML driver circuit, explained with reference to FIGS. 5 and 6, suffers from a problem that the current consumption is increased when it is attempted to decrease the jitter. That is, the reduction in the jitter and the current consumption are in a relationship of trade-off to each other, as will now be explained.

If, in the CML buffer circuit, having the preemphasis function, as shown in FIG. 5, the amplitude at the time of preemphasis is Vemp and that at the time of deemphasis is VdeEmp, the degree of the amplitude emphasis is given by Vemp/VdeEmp.

At a timing t3 of FIG. 6, Vemp and VdeEmp are given by the following equations (5) and (6), respectively:

$$V\text{emp}=(I\text{Data}+I\text{Emp})\cdot\{R\text{out1}/(R\text{out1}+R\text{out2}+R\text{term1}+R\text{term2})\}\times(R\text{term1}+R\text{term2}) \quad (5)$$

$$V\text{deEmp}=(I\text{Data}-I\text{Emp})\cdot\{R\text{out1}/(R\text{out1}+R\text{out2}+R\text{term1}+R\text{term2})\}\times(R\text{term1}+R\text{term2}) \quad (6)$$

In a generally used CML driver,
Rout1=Rout2=Rterm1=Rterm2 so that Vemp and VdeEmp may be expressed by the following equations (7) and (8):

$$V\text{emp}=(I\text{Data}+I\text{Emp})\times(\tfrac{1}{2})\times R\text{out1} \quad (7)$$

$$V\text{deEmp}=(I\text{Data}-I\text{Emp})\times(\tfrac{1}{2})\times R\text{out1} \quad (8)$$

From the foregoing, the degree of amplitude emphasis may be expressed by the following equation (9):

$$Vemp/VdeEmp = (IData + IEmp)/(IData - IEmp) \qquad (9)$$

If simply the degree of amplitude emphasis is to be increased, it is sufficient that the ratio of IData to IEmp or IData/IEmp is increased. However, if the relationship of the post-transmission amplitude=VdeEmp or an inherent amplitude is to be maintained, it is necessary to increase IData and IEmp together. This increase in IData and IEmp is accompanied by increase in IData−IEmp, or in the overall current in the CML driver circuit. FIG. 8 shows concrete values of calculations carried out by the present inventor. In FIG. 8, there are shown exemplary values of the current IData and the current IEmp in the current sources CS1 and CS2, the sums of these currents IData+IEmp, Vemp, VdeEmp and the degree of amplitude emphasis Vemp/VdeEmp, for the case of reference, the case where the total current is fixed, and the case where the amplitude at the time of deemphasis is fixed.

An output buffer circuit of a current mode type in accordance with an aspect of the present invention includes an output resistor pair between an output pair of a differential circuit and a power supply and a circuit for performing variable control of resistance value of the output resistor pair to make the resistance value relatively larger and smaller at the time of preemphasis and at the time of deemphasis, respectively.

A output buffer circuit according to the present invention comprises:

a first differential pair for differentially receiving a data signal; and a second differential pair for differentially receiving an emphasis data signal;

output pairs of said first and second differential pairs being connected in common, respective common connection nodes of said output pairs constituting first and second output nodes;

first and second output resistor circuits connected between the first and second output nodes and a first power supply; said first and second output resistor circuits including first and second variable resistance elements, respectively; the resistance values of said first and second variable resistance elements being varied by a control signal received; and a logic circuit for receiving the data signal and the emphasis data signal and for outputting the control signal, which is of a first value at the time of preemphasis when the amplitude of an output signal is to be emphasized as the logic of the output signal undergoes a transition, said control signal being of a second value otherwise; said control signal being supplied to said first and second variable resistance elements.

Preferably, in the present invention, switching control is made so that, at the time of preemphasis, the first and second variable resistance elements have a relatively large resistance value, and so that, at the time of deemphasis, the first and second variable resistance elements have a relatively small resistance value.

Preferably, in the present invention, the emphasis data signal is the data signal delayed a preset time and inverted.

Preferably, in the present invention, the first output resistor circuit includes a first output resistor connected between the first output node and the first power supply and a first series circuit of a first resistance element and a first transistor, connected between the first output node and the first power supply and in parallel with the first output resistor. The second output resistor circuit preferably includes a second output resistor connected between the second output node and the first power supply and a second series circuit of a second resistance element and a second transistor, connected between the second output node and the first power supply and in parallel with the second output resistor. The control signal from the logic circuit may be supplied to control terminals of the first and second transistors.

Preferably, in the present invention, the first and second transistors are of a conductivity type opposite to that of the differential transistor pairs constituting the first and second differential pairs.

According to the present invention, the first output resistor circuit preferably includes a first parallel circuit, made up by a first resistance element and a first transistor, and a first output resistor. The first parallel circuit and the first output resistor may be connected in series with each other between the first output node and the first power supply. The second resistance element preferably includes a second parallel circuit, made up by a second resistance element and a second transistor, and a second output resistor. The second parallel circuit and the second output resistor may be connected in series with each other between the second output node and the first power supply. The control signal from the logic circuit may be supplied to control terminals of the first and second transistors.

According to the present invention, the first and second transistors are of same conductivity type as that of the differential transistor pairs constituting the first and second differential pairs.

The meritorious effects of the present invention are summarized as follows.

According to the present invention, the output resistors are variably controlled in association operatively with the operation of preemphasis, such that, when the preemphasis function is applied, the jitter may be diminished without increasing the current consumption.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 is a diagrammatic view showing a list of calculated values of the current and the amplitude in case of elevating the degree of amplitude stressing.

FIG. 11 is a diagrammatic view showing characteristics of an embodiment of the present invention and those of a conventional circuit.

PREFERRED EMBODIMENTS OF THE INVENTION

Figure 1:
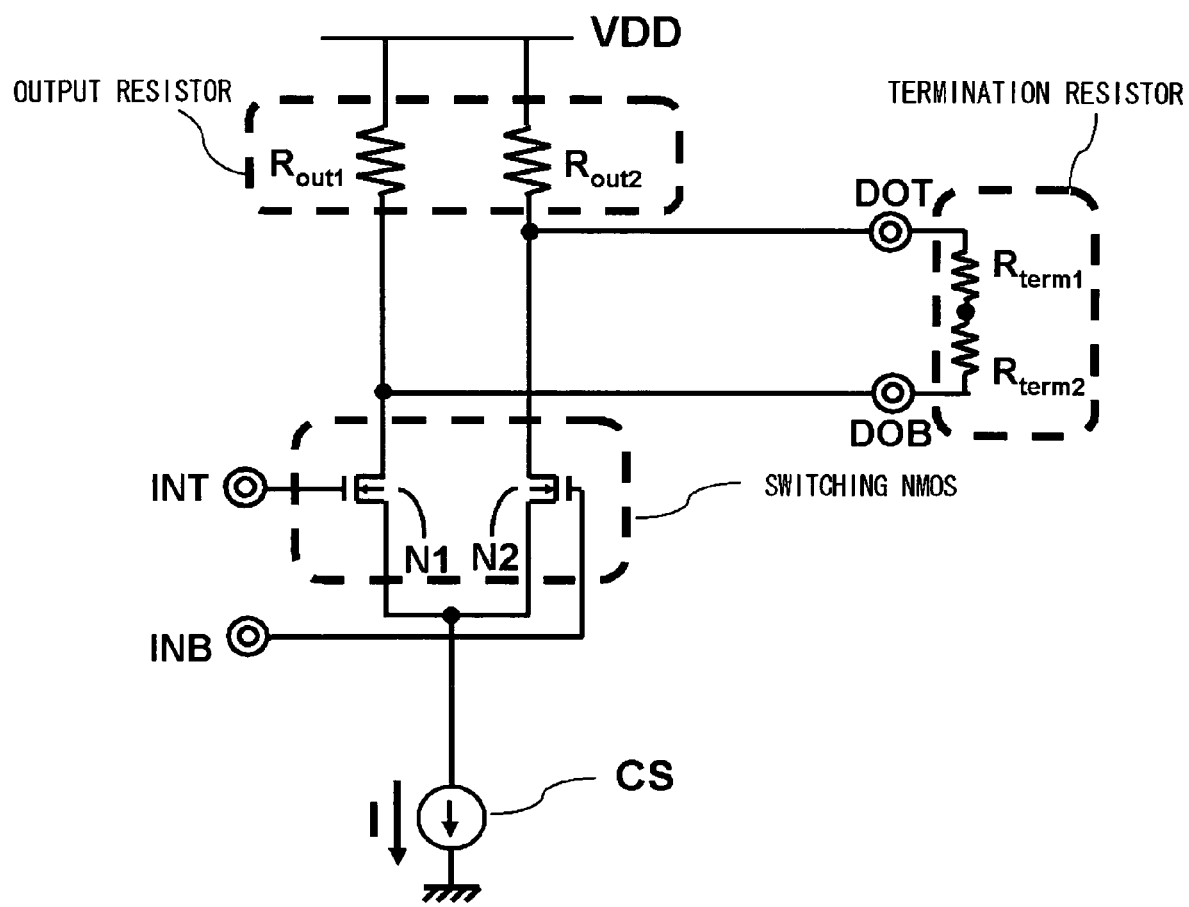
FIG. 1 is a circuit diagram showing a typical configuration of a CML driver circuit.
Figure 2:
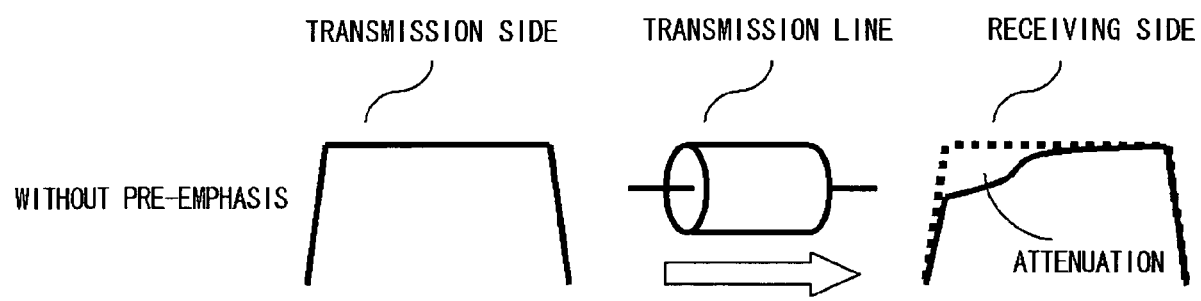
FIG. 2 is a schematic view for illustrating the concept of signal attenuation on a transmission line.
Figure 3:
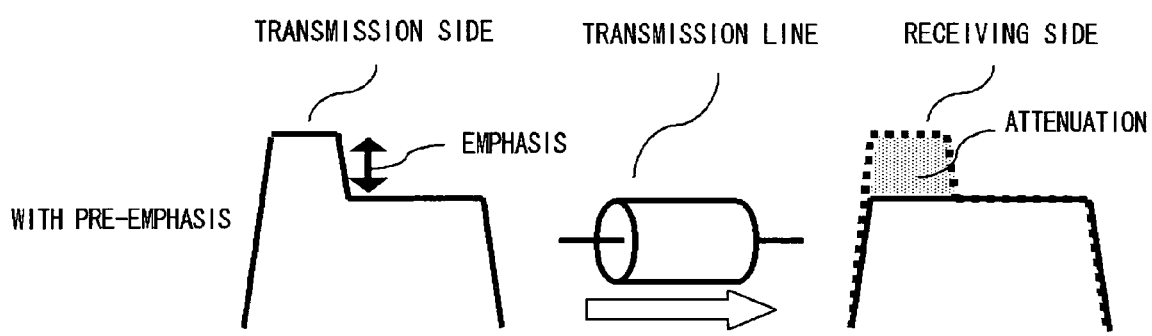
FIG. 3 is a schematic view for illustrating the outline of preemphasis.
Figure 4:
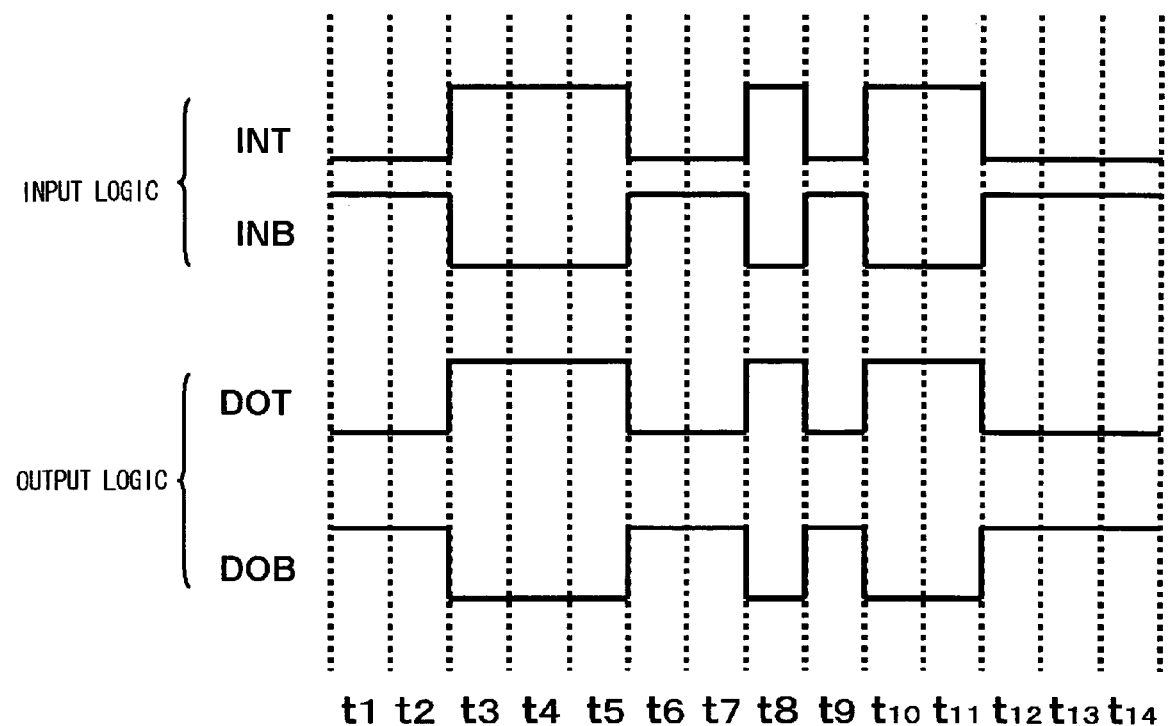
FIG. 4 is a timing chart showing a signal waveform in a CML driver circuit.

Referring to the drawings, the present invention will now be described in further detail. The output buffer circuit of the current mode logic, according to the present invention, includes an output resistor between an output pair of a differential circuit and a power supply and has a preemphasis function emphasizing the amplitude when the logic of an output signal undergoes a transition. The output buffer circuit performs switching control so that, at the time of preemphasis, the resistance value of the output resistor will be relatively larger. After the preemphasis, when the output signal is at the same logic as that to which the output signal has transitioned, deemphasis is performed for decreasing the amplitude emphasized. At this time, switching control is exercised so that the resistance value of the output resistor will become relatively smaller. More specifically, the output buffer circuit includes variable resistance elements (P1 and P2 of FIG. 9 and N1 and N2 of FIG. 14) associated with the output resistors connected between the output pairs of the differential circuit and the power supply. The control terminals of those variable resistance elements receive a control signal, the value of which is switched between a value for emphasis and another value for deemphasis, such as to vary the resistance values of the output resistors. In the following, preferred embodiments of the present invention will be described in detail.

Figure 9:
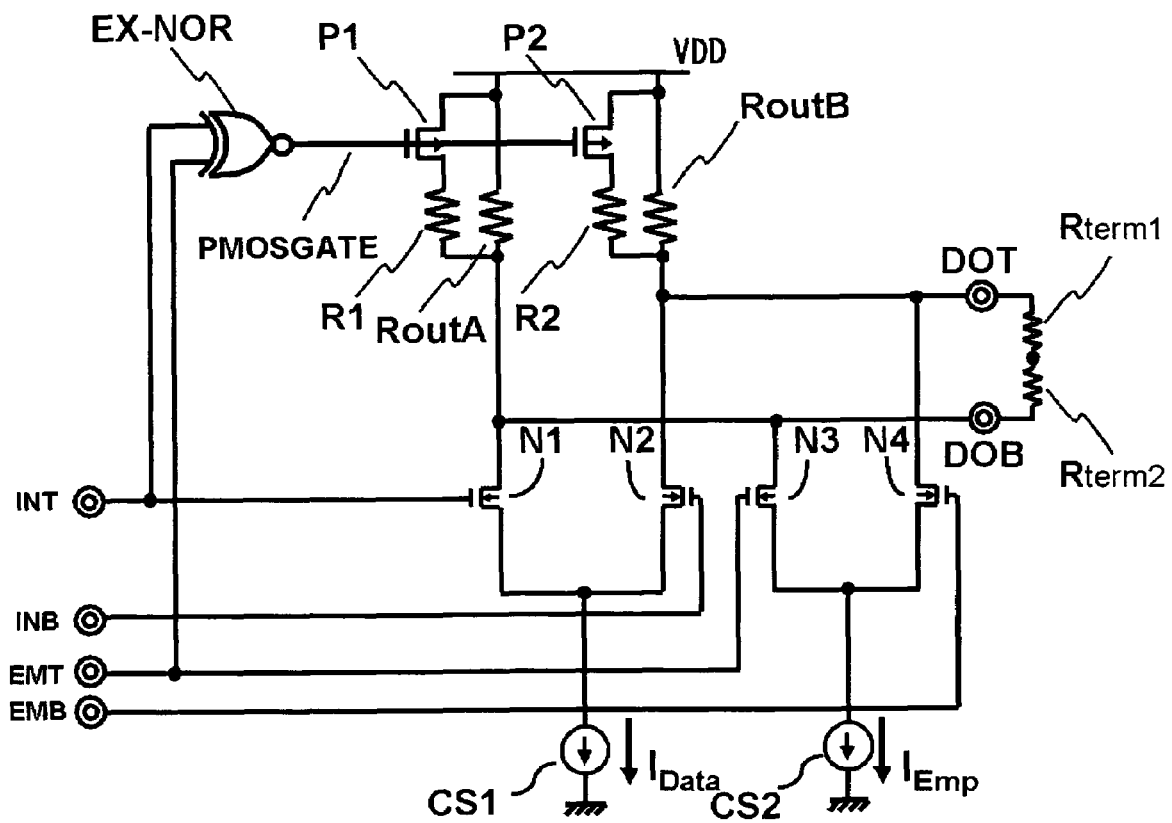
FIG. 9 is a circuit diagram showing the configuration of an embodiment of the present invention.

FIG. 9 is a diagram showing the configuration of a CML driver circuit according to an embodiment of the present invention. Referring to FIG. 9, the CML driver circuit of the present embodiment includes a differential circuit comprising NMOS transistors N1 and N2, and another differential circuit comprising NMOS transistors N3 and N4. The NMOS transistors N1 and N2 have sources connected in common to a constant current source CS1, have gates connected to differential input terminals INT and INB for differentially receiving data, respectively, and drains connected to the power supply VDD via output resistors RoutA and RoutB, respectively. The NMOS transistors N3 and N4 have sources connected in common to a constant current source CS2, gave gates connected to differential input terminals EMT and EMB for differentially receiving emphasis data, respectively, and have drains connected to the power supply VDD via output resistors RoutA and RoutB, respectively. The drains of the NMOS transistors N2 and N4 are connected in common to the output terminal DOT, and the drains of the NMOS transistors N1 and N3 are connected in common to the output terminal DOB. A series circuit of a P channel MOS transistor (PMOS transistor) P1 and a resistor R1 is connected in parallel with the output resistor RoutA, between the power supply VDD and the coupled drains of the NMOS transistors N1 and N3. A series circuit of a P channel MOS transistor (PMOS transistor) P2 and a resistor R2 is connected in parallel with an output resistor RoutB, between the power supply VDD and the coupled drains of the NMOS transistors N2 and N4. There is also provided an exclusive NOR (EX-NOR) circuit for receiving the data INT and the emphasis data EMT. An output of the EX-NOR circuit is connected to both gates of the PMOS transistors P1 and P2.

Figure 10:
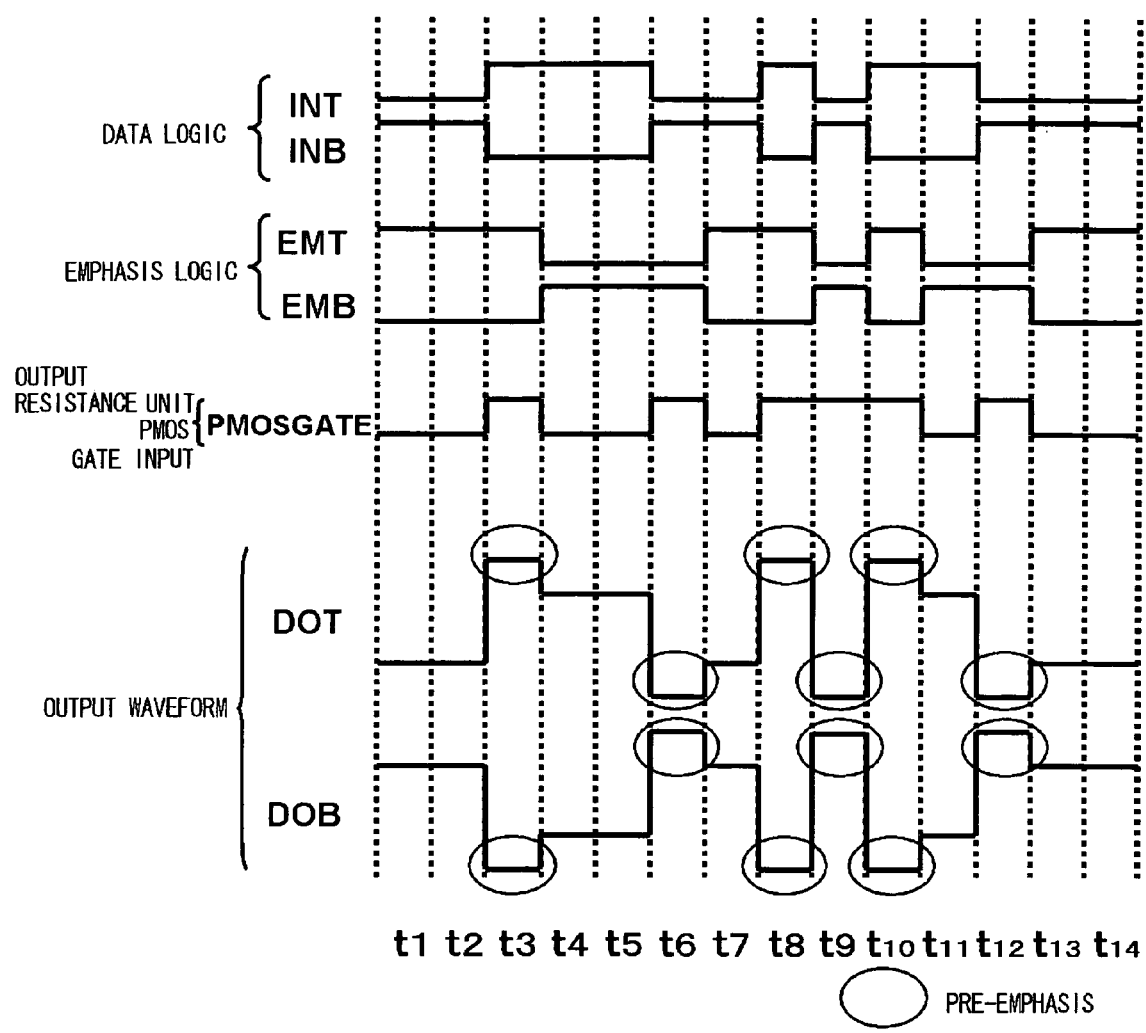
FIG. 10 is a timing chart showing the signal waveform in an embodiment of the present invention.

In the circuit shown in FIG. 9, signal waveforms which are shown in FIG. 10, are supplied to the differential input terminals INT and INB. In FIG. 10, PMOSGATE is a signal at an output node of the EX-NOR circuit (see FIG. 9). PMOSGATE is also a signal waveform at the gate terminals of the PMOS transistors of the PMOS transistors P1 and P2.

Figure 6:
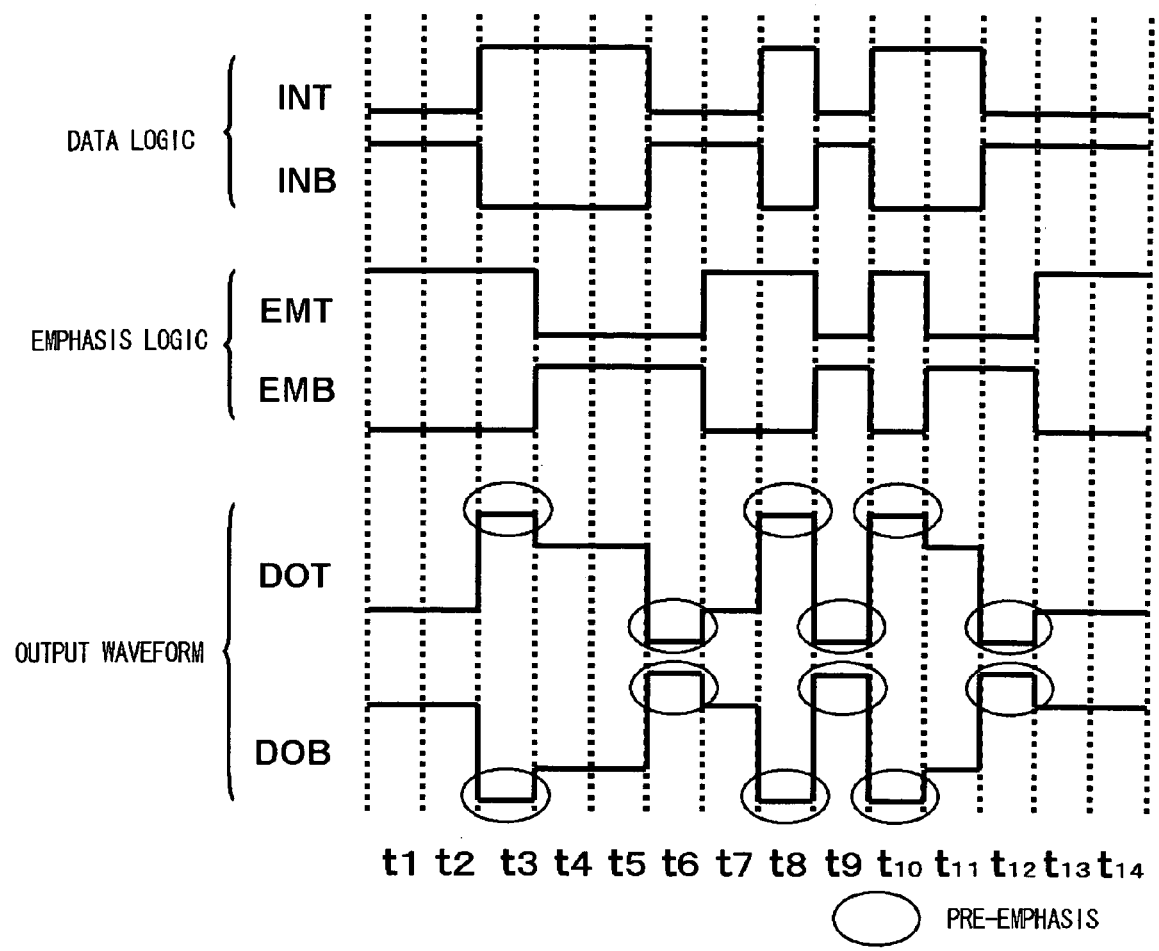
FIG. 6 is a timing chart showing a signal waveform of the CML driver circuit having a preemphasis function.
Figure 7A:
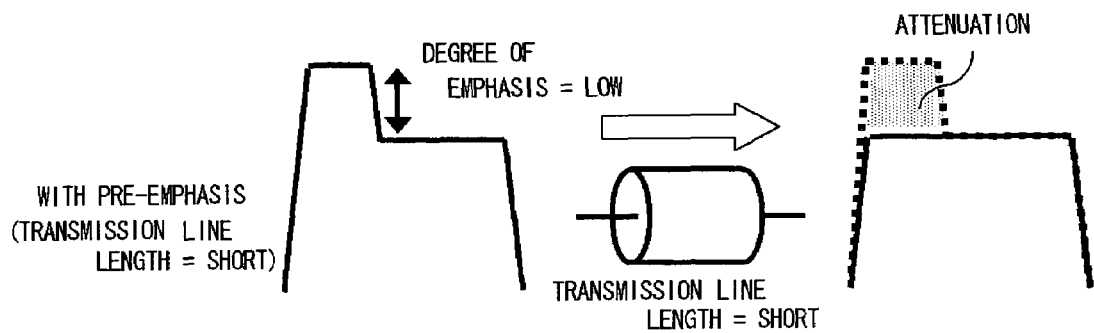
FIGS. 7A and 7B are schematic views for illustrating the relationship between the length of the transmission line and the degree of stressing the preemphasis.
Figure 7B:
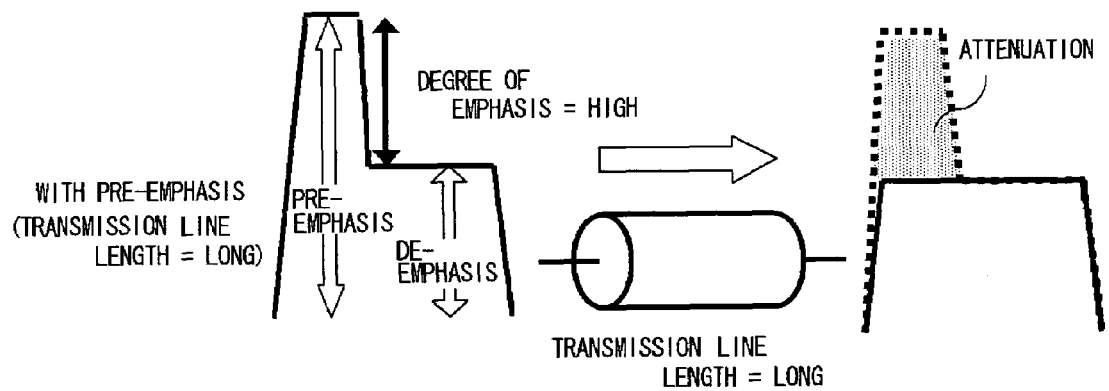

The signals supplied to the terminals INT and INB, EMT and EMB, connected to the gates of the NMOS transistors N1 and N2, N3 and N4, respectively, are the same as those shown in FIG. 6.

In this case, the logic of the output PMOSGATE of the EX-NOR circuit is associated with the preemphasis operation of the output waveform, so that the EX-NOR circuit outputs the high voltage only at the preemphasis timings t3, t6, t8, t9, t10 and t12, while outputting the low voltage at other timings.

Hence, the PMOS transistors P1 and P2 are in an off state, at the preemphasis timings of t3, t6, t8, t9, t10 and t12, so that each impedance of PMOS transistors P1 and P2 is increased. At other timings, which are those for deemphasis, the PMOS transistors P1 and P2 are in an on state, so that each impedance of PMOS transistors P1 and P2 is decreased.

The PMOS transistors P1 and P2 and the resistors R1 and R2 are connected in parallel with the output resistors RoutA and RoutB, as described above.

The output resistance of the driver therefore is a combined resistance of the output resistor RoutA and the resistance of the series connection of the PMOS transistor P1 and the resistor R1, and a combined resistance of the output resistor RoutB and the resistance of the series connection of the PMOS transistor P2 and the resistor R2.

Thus, by applying the input signal waveforms, shown in FIG. 10, to the circuit shown in FIG. 9, PMOSGATE becomes high at the time of preemphasis, for example, at the timing t3, and hence the impedance of the PMOS transistors P1 and P2 becomes larger at the time of preemphasis. This state is the state of high output resistance of the CML driver circuit. In similar manner, the impedance of the PMOS transistors P1 and P2 becomes smaller, that is, the state of low output resistance of the CML driver circuit, may be generated at the time of deemphasis.

Figure 5:
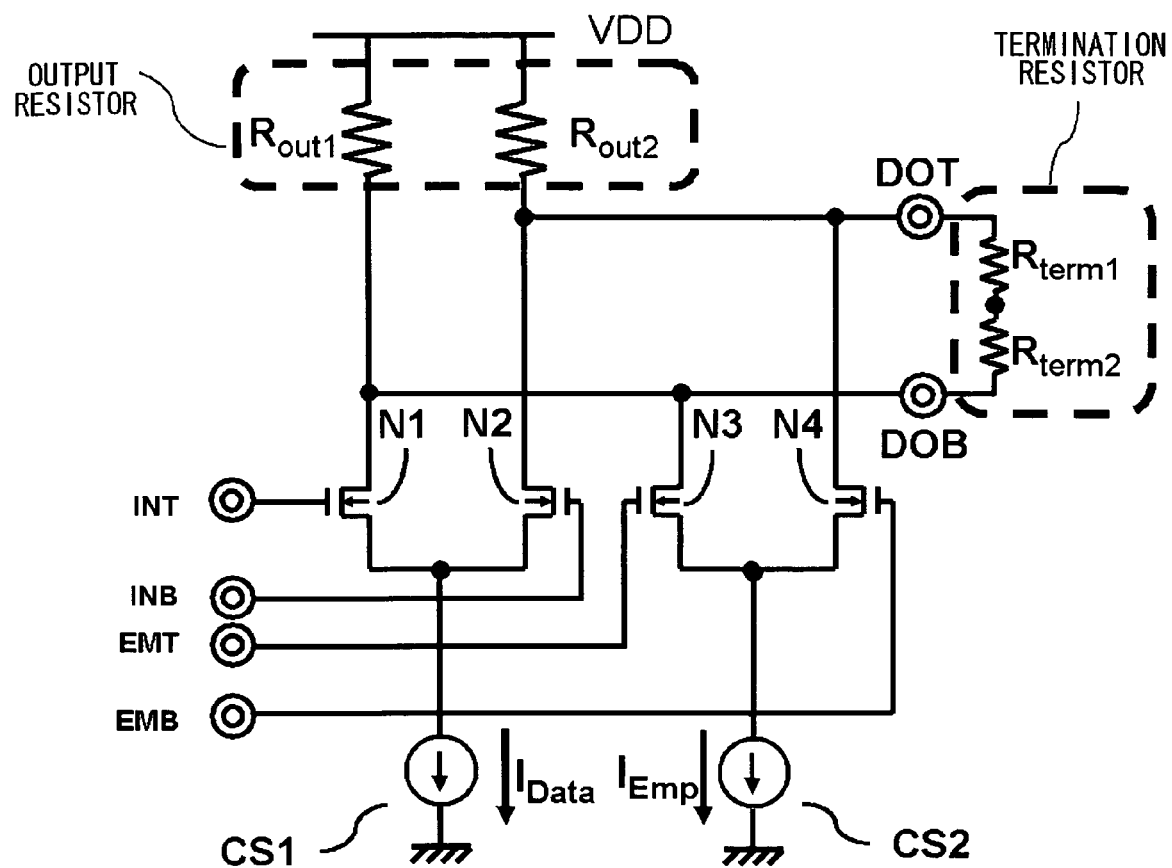
FIG. 5 is a circuit diagram showing the configuration of a CML driver circuit having a preemphasis function.

The amplitude of the CML driver circuit, having the preemphasis function, may be determined from the following equations (10) and (11):

$$V\text{emp} = (I\text{Data} + I\text{Emp}) \cdot \{R\text{out1}/(R\text{out1} + R\text{out2} + R\text{term1} + R\text{term2})\} \times (R\text{term1} + R\text{term2}) \quad (10)$$

$$V\text{deEmp} = (I\text{Data} - I\text{Emp}) \cdot \{R\text{out1}/(R\text{out1} + R\text{out1} + R\text{out2} + R\text{term1} + R\text{term2})\} \times (R\text{term1} + R\text{term2}) \quad (11)$$

where the symbols used correspond to those used in FIG. 5.

It is seen from the above equations (10) and (11) that, by increasing resistance values of the output resistors Rout1 and Rout2, the amplitude may be increased without increasing the currents IData and IEmp.

In contrast, with the present embodiment, the degree of amplitude emphasis may be increased by increasing resistance values of the output resistors Rout1 and Rout2, solely at the time of preemphasis, without increasing the current consumption or without decreasing the amplitude at the time of deemphasis.

That is, in comparison with the conventional CML driver circuit, shown for example in FIG. 5, in which jitter reduction and the current consumption are in a relationship of tradeoff with each other, it is possible with the present embodiment to reduce the jitter without increasing the power consumption.

FIG. 11 shows the currents IData and IEmp of the current sources CS1 and CS2 of FIGS. 5 and 9, the current sum IData+IEmp, Vemp, VdeEmp, the degree of amplitude emphasis Vemp/VdeEmp and the jitter (ps), for the cases of not taking measures for reducing the jitter, taking the measures for reducing the jitter, in accordance with the embodiment of the present invention, shown in FIG. 9, and taking measures for reducing the jitter in accordance with the conventional CML driver circuit shown in FIG. 5. With the preferred embodiment of the present invention, the jitter (99.6 ps) has been reduced by as much as 24% from the value for the case of not taking measures for reducing the jitter (131 ps) despite the fact that the currents IData and IEmp remain the same as those for the case of not taking measures for reducing the jitter. If, in the case of taking measures for reducing the jitter in accordance with the conventional CML driver circuit shown in FIG. 5, both the currents IData and IEmp are higher than those of the preferred embodiment of the present invention, while the degree of amplitude emphasis Vemp/VdeEmp is larger than that of the preferred embodiment of the present invention, if the meritorious effect in reducing the jitter, which is comparable to that of the present invention, is to be attained.

Figure 12:
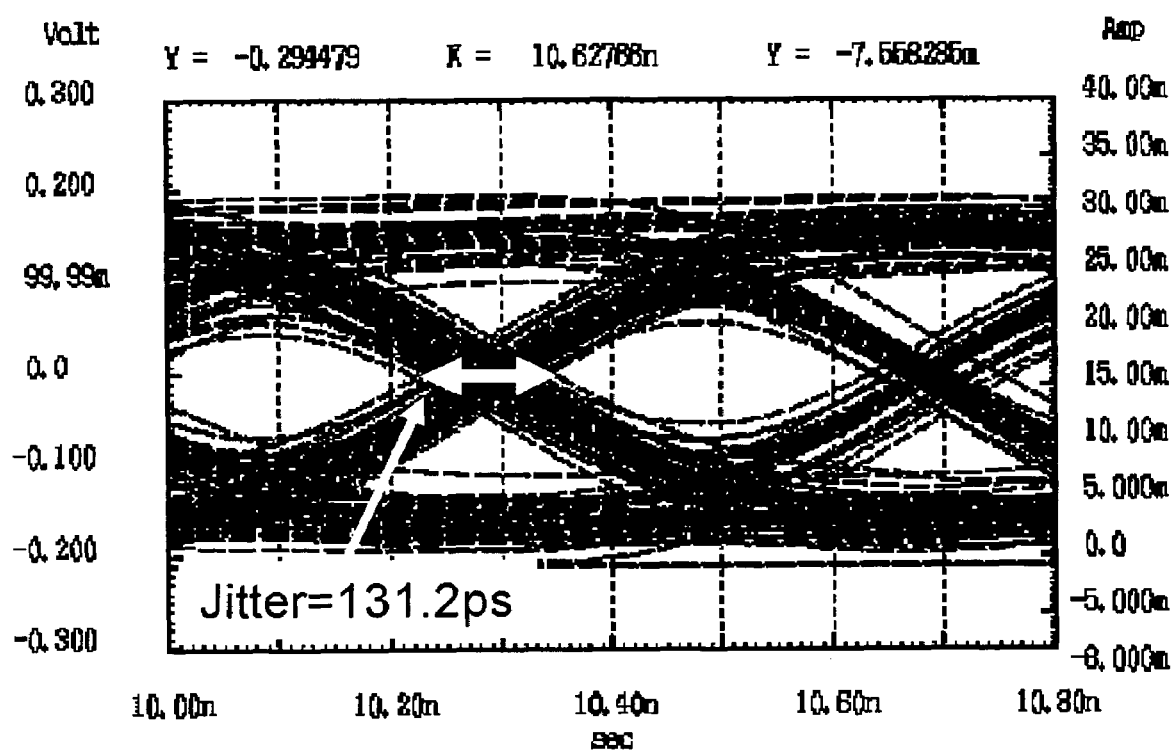
FIG. 12 is a graph showing a waveform of simulation of a conventional circuit.
Figure 13:
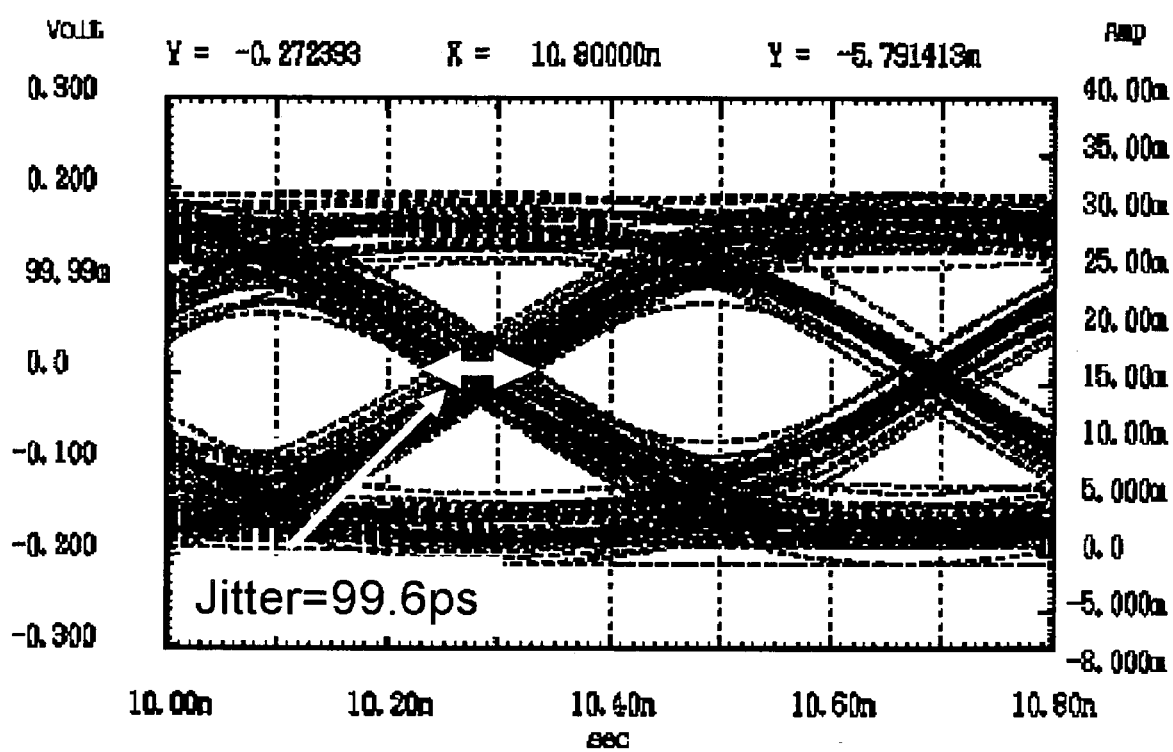
FIG. 13 is a graph showing a waveform of simulation of a second embodiment of the present invention.

FIG. 12 shows the results of simulation of the conventional CML driver circuit for the case of not taking measures for reducing the jitter. FIG. 13 shows the results of simulation of the embodiment of the present invention shown in FIG. 9. In FIGS. 12 and 13, the jitter is 131.2 ps and 99.6 ps, respectively.

Figure 14:
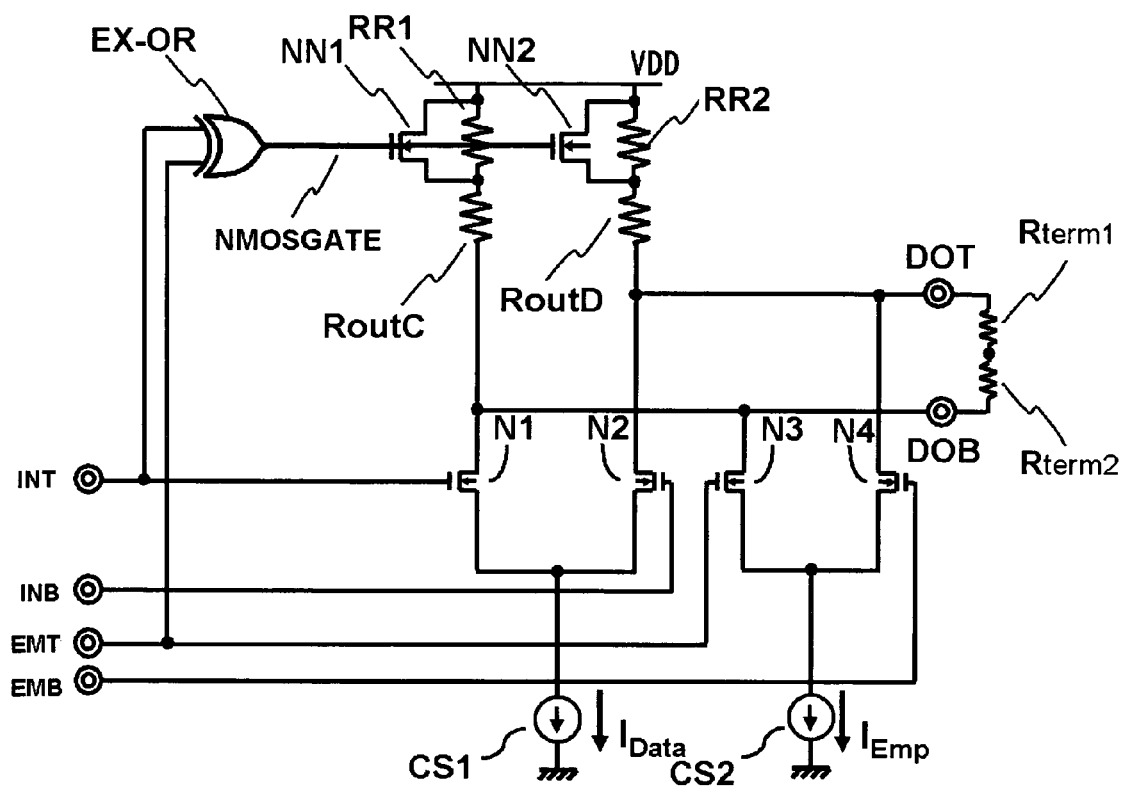
FIG. 14 is a circuit diagram showing the configuration of a second embodiment of the present invention.

A second embodiment of the present invention will now be described. FIG. 14 is a diagram showing the configuration of the second embodiment of the present invention. Referring to FIG. 14, in the present embodiment, a series connection of a parallel circuit of a resistor RR1 and an NMOS transistor NN1 and an output resistor RoutC is connected between the power supply and the coupled drains of NMOS transistors N1, N3, constituting a differential pair. In similar manner, a series connection of a parallel circuit of a resistor RR2 and an NMOS transistor NN2 and an output resistor RoutD is connected between the power supply and the coupled drains of NMOS transistors N2, N4, constituting another differential pair. In the present embodiment, the adjustment unit for adjusting the output resistance is changed from the configuration of the first embodiment consisting in the series circuits of the PMOS transistors and the output resistor elements (the series circuit of P1 and R1 and the series circuit of P2 and R2) to the parallel circuit of the NMOS transistor NN1 and the resistance element RR1 and to the parallel circuit of the NMOS transistor NN2 and the resistance element RR2. In addition, the parallel circuits and the output resistors are connected in series between the power supply and the differential output terminals.

As shown in FIG. 14, the exclusive NOR (EX-NOR) circuit of FIG. 9 is replaced by an exclusive OR (EX-OR) circuit.

Figure 15:
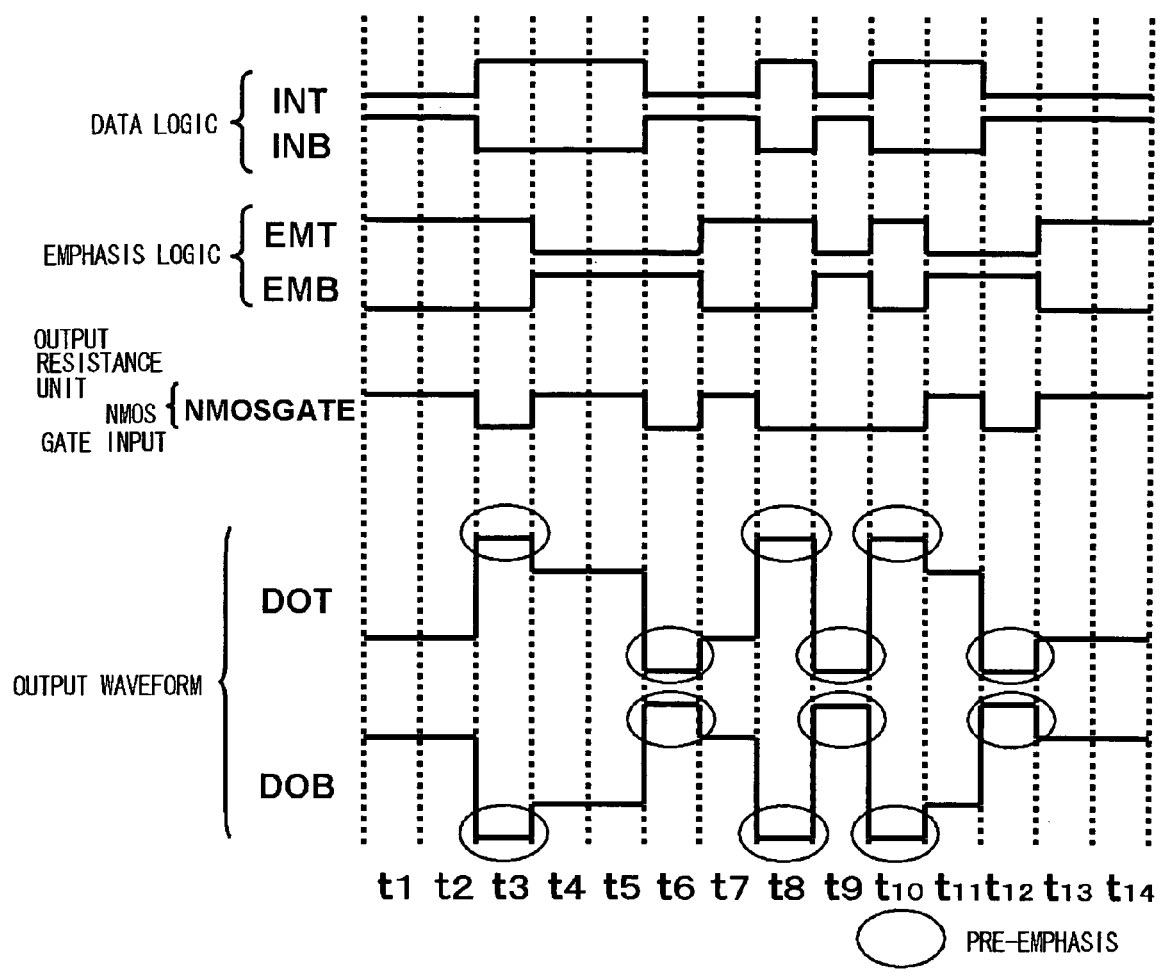
FIG. 15 is a timing chart showing a signal waveform of the second embodiment of the present invention.

The waveform at each point of the input waveform is shown in FIG. 15, in which NMOSGATE, which is an output of the EX-OR, and which is also the gate terminals of the NMOS transistors NN1 and NN2, outputs a low side potential only at timings of preemphasis of t3, t6, t8, t9, t10 and t12, shown in FIG. 15, while outputting a high side potential at the other timings.

Thus, the NMOS transistors NN1 and NN2 are set in an off state at the time of preemphasis and each impedance of the NMOS transistors NN1 and NN2 then is increased. The NMOS transistors NN1 and NN2 are set in an on state at the time of deemphasis and each impedance of the NMOS transistors NN1 and NN2 is then decreased.

On the other hand, the NMOS transistor NN1 is connected in parallel with the resistor RR1, while the NMOS transistor NN2 is connected in parallel with the resistor RR2. Hence, the output resistor of the driver circuit of FIG. 14 is a combined resistance of a parallel connection of the NMOS transistor NN1 and the resistor RR1 and the resistor RoutC connected in series with this parallel connection, and a combined resistance of a parallel connection of the NMOS transistor NN2 and the resistor RR2 and the resistor RoutD connected in series with this parallel connection.

In light of the foregoing, the impedance of the NMOS transistors NN1 and NN2 becomes larger, that is, the output resistance value becomes larger, at the time of preemphasis, while the impedance of the NMOS transistors NN1 and NN2 becomes smaller, that is, the output resistor value becomes smaller, at the time of deemphasis. Thus, the present embodiment has the same meritorious effect and result as those of the previous embodiment. Although the present invention has so far been explained with reference to the preferred embodiments, the present invention is not limited to the particular configurations of these embodiments and, as will be apparent to those skilled in the art, the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An output buffer circuit equipped with a preemphasis function in which the amplitude of an output signal is emphasized when the logic of the output signal undergoes a transition, said output buffer circuit comprising:
    a first differential circuit having a first differential pair for differentially receiving a data signal; and
    a second differential circuit having a second differential pair for differentially receiving an emphasis data signal;
    output pairs of said first and second differential circuits being connected in common, respective common connection nodes of said output pairs constituting first and second output nodes;
    an output resistor pair arranged between the output pairs of the first and second differential circuits and a power supply; and
    a control circuit for performing switching control of a resistance value of said output resistor pair, so that said output resistor pair has a relatively larger resistance value at the time of preemphasis.

2. The output buffer circuit according to claim 1, wherein said control circuit performs switching control so that, at the time of deemphasis when, after said transition of said output signal, the logic of the output signal remains the same as the logic to which the output signal has transitioned, and the emphasized amplitude is to be reduced, said output resistor pair has a relatively smaller resistance value.

3. The output buffer circuit according to claim 1, wherein the output buffer circuit comprises a current mode logic circuit.

4. An output buffer circuit comprising:
a first differential pair for differentially receiving a data signal; and
a second differential pair for differentially receiving an emphasis data signal;
output pairs of said first and second differential pairs being connected in common, respective common connection nodes of said output pairs constituting first and second output nodes;
first and second output resistor circuits connected between the first and second output nodes and a first power supply; said first and second output resistor circuits including first and second variable resistance elements, respectively; the resistance values of said first and second variable resistance elements being varied by a control signal received; and
a logic circuit for receiving the data signal and the emphasis data signal and for outputting the control signal, which is of a first value at the time of preemphasis when the amplitude of an output signal is to be emphasized as the logic of the output signal undergoes a transition, said control signal being of a second value otherwise; said control signal being supplied to said first and second variable resistance elements.

5. The output buffer circuit according to claim 4, wherein switching control is made so that at the time of preemphasis, said first and second variable resistance elements have a relatively large resistance value, and so that at the time of deemphasis when, after said transition of said output signal, the logic of said output signal remains the same as the logic to which the output signal has transitioned and the emphasized amplitude is to be reduced, said first and second variable resistance elements have a relatively small resistance value.

6. The output buffer circuit according to claim 4, wherein said emphasis data signal is said data signal delayed a preset time and inverted.

7. The output buffer circuit according to claim 4, wherein said first output resistor circuit includes:
a first output resistor connected between said first output node and said first power supply; and
a first series circuit made up of a first resistance element and a first transistor, said first series being connected between said first output node and said first power supply in parallel with said first output resistor; wherein
said second output resistor circuit includes:
a second output resistor connected between said second output node and said first power supply, and
a second series circuit made up of a second resistance element and a second transistor, said second series circuit being connected between said second output node and said first power supply in parallel with said second output resistor; and wherein
said control signal from said logic circuit is supplied to control terminals of said first and second transistors.

8. The output buffer circuit according to claim 4, wherein said first output resistor circuit includes:
a first parallel circuit, made up of a first resistance element and a first transistor, and a first output resistor; said first parallel circuit and said first output resistor being connected in series with each other between said first output node and said first power supply; wherein
said second output resistor circuit includes:
a second parallel circuit, made up by a second resistance element and a second transistor, and a second output resistor; said second parallel circuit and said second output resistor being connected in series with each other between said second output node and said first power supply; and wherein
said control signal from said logic circuit is supplied to control terminals of said first and second transistors.

9. The output buffer circuit according to claim 4, wherein said first and second differential pairs are connected to a second power supply via first and second current sources adapted for supplying the currents to said first and second differential pairs, respectively.

* * * * *